United States Patent
Kasahara

(10) Patent No.: US 10,964,553 B2
(45) Date of Patent: Mar. 30, 2021

(54) MANUFACTURING METHOD OF SEMICONDUCTOR DEVICE AND SEMICONDUCTOR DEVICE

(71) Applicant: SHINKO ELECTRIC INDUSTRIES CO., LTD., Nagano (JP)

(72) Inventor: Tetsuichiro Kasahara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/594,174

(22) Filed: Oct. 7, 2019

(65) Prior Publication Data
US 2020/0118837 A1   Apr. 16, 2020

(30) Foreign Application Priority Data

Oct. 11, 2018   (JP) .............................. JP2018-192981

(51) Int. Cl.
| | |
|---|---|
| H01L 21/48 | (2006.01) |
| H01L 21/56 | (2006.01) |
| H01L 25/18 | (2006.01) |
| H01L 23/367 | (2006.01) |
| H01L 23/31 | (2006.01) |
| H01L 23/00 | (2006.01) |
| H01L 23/498 | (2006.01) |

(52) U.S. Cl.
CPC ........ *H01L 21/4853* (2013.01); *H01L 21/481* (2013.01); *H01L 21/561* (2013.01); *H01L 23/3107* (2013.01); *H01L 23/3675* (2013.01); *H01L 23/49811* (2013.01); *H01L 24/16* (2013.01); *H01L 24/48* (2013.01); *H01L 25/18* (2013.01); *H01L 2224/16227* (2013.01); *H01L 2224/48227* (2013.01)

(58) Field of Classification Search
CPC .................................................. H01L 21/4853
See application file for complete search history.

(56) References Cited

U.S. PATENT DOCUMENTS

| | | | |
|---|---|---|---|
| 2012/0119360 A1* | 5/2012 | Kim ................... | H01L 23/49811 257/737 |
| 2012/0217634 A9 | 8/2012 | Shim et al. | |
| 2017/0287730 A1* | 10/2017 | Mazzola ................ | H01L 21/56 |

* cited by examiner

*Primary Examiner* — William A Harriston
(74) *Attorney, Agent, or Firm* — Rankin, Hill & Clark LLP

(57) ABSTRACT

A manufacturing method of a semiconductor device includes mounting a semiconductor element on a first electrode disposed on a first surface of a substrate; preparing a metal plate including a main body part and a projection part; mounting the metal plate on the first surface side of the substrate, by joining the projection part to a second electrode that is disposed on the first surface of the substrate; sealing the semiconductor element and the projection part with a sealing resin; and forming an electrode terminal made of a base end part that is connected to the second electrode and has a side surface that is covered by the sealing resin, and a tip end part that is integrally formed with the base end part and that projects from a front surface of the sealing resin, by etching the main body part excluding a portion overlapping with the projection part.

3 Claims, 14 Drawing Sheets

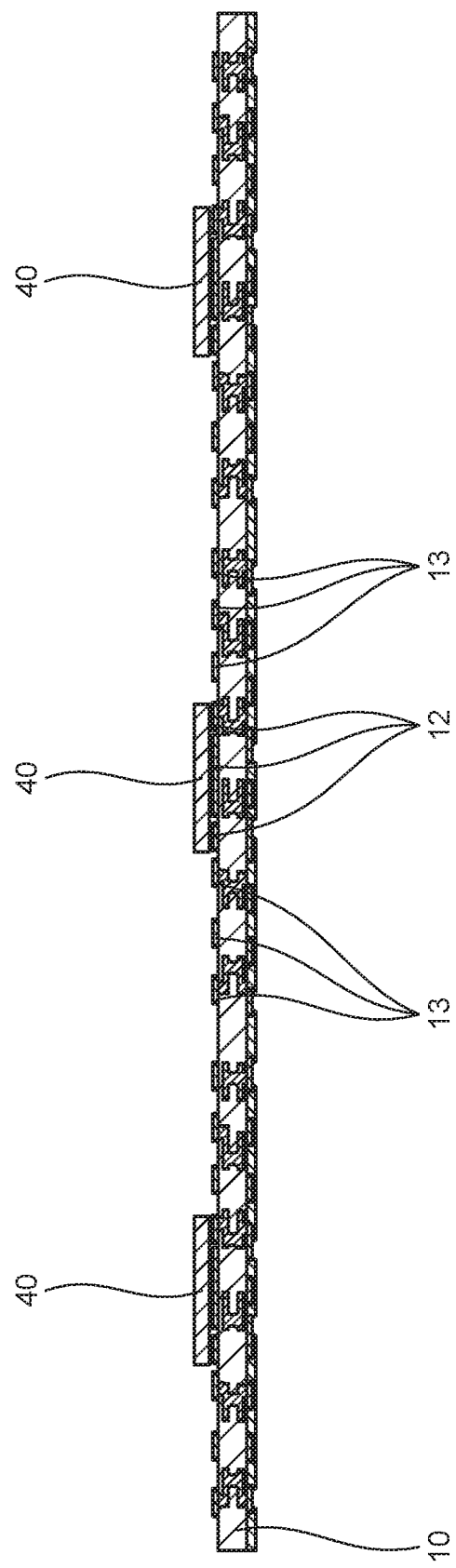

MANUFACTURING METHOD OF SEMICONDUCTOR DEVICE AND SEMICONDUCTOR DEVICE

CROSS-REFERENCE TO RELATED APPLICATION

This application is based upon and claims the benefit of priority of the prior Japanese Patent Application No. 2018-192981, filed on Oct. 11, 2018, the entire contents of which are incorporated herein by reference.

FIELD

The embodiment discussed herein is related to a manufacturing method of a semiconductor device and a semiconductor device.

BACKGROUND

Conventionally, a wet process called a semi-additive process (SAP) method has been known as a method for forming an electrode terminal drawn out to the outside of a semiconductor device. In the SAP method, a semiconductor element is mounted on a substrate; the substrate, the semiconductor element, and an electrode on the substrate are sealed by a sealing resin; and a via hole to expose the electrode on the substrate is formed on the sealing resin by using laser and the like. Then, in the SAP method, the substrate mounted with the semiconductor element is immersed into an electrolyte solution, and a conductive material such as plating is filled into the via hole of the sealing resin. Consequently, in the semiconductor device, the electrode terminal that is connected to the electrode on the substrate and the tip end part of which is exposed from the sealing resin is formed (U.S. Patent No. 2012/0217634).

However, when an electrode terminal is formed by using the SAP method, the following problems occur.

That is, in recent years, in the semiconductor device, with an increase in the thickness of the sealing resin that covers the semiconductor element, the aspect ratio of a via hole formed on the sealing resin tends to increase. When the aspect ratio of the via hole increases, the via hole is sometimes not completely filled with a conductive material such as plating. Even if the via hole is filled with the conductive material, it takes a long time to fill the via hole. Moreover, when a wet process such as the SAP method is applied on the semiconductor element having relatively low resistance against an electrolyte solution, the semiconductor element may be damaged.

Furthermore, the electrode terminal formed by using the SAP method includes a discontinuous corner at a boundary portion between a base end part covered by the sealing resin and a tip end part exposed from the sealing resin. In the semiconductor device, the sealing resin comes into contact with the corner of the electrode terminal. In a structure in which the sealing resin comes into contact with the corner of the electrode terminal, when the electrode terminal is connected to a printed circuit board (PCB), the stress is concentrated on the sealing resin that comes into contact with the corner. Consequently, a crack may be generated on the sealing resin.

SUMMARY

According to an aspect of an embodiment, a manufacturing method of a semiconductor device includes mounting a semiconductor element on a first electrode disposed on a first surface of a substrate; preparing a metal plate including a main body part and a projection part that rises from the main body part; mounting the metal plate on a side of the first surface of the substrate, by joining the projection part to a second electrode that is disposed on the first surface of the substrate; sealing the semiconductor element and the projection part with a sealing resin, by filling the sealing resin between the first surface of the substrate and the main body part of the metal plate; and forming an electrode terminal made of a base end part that is connected to the second electrode and has a side surface that is covered by the sealing resin, and a tip end part that is integrally formed with the base end part and that projects from a front surface of the sealing resin, by etching the main body part excluding a portion overlapping with the projection part in the main body part in a plan view.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is an explanatory diagram illustrating an example of a flow of a manufacturing method of a semiconductor device according to the embodiment;

DESCRIPTION OF EMBODIMENT

Hereinafter, an embodiment of a manufacturing method of a semiconductor device and a semiconductor device disclosed in the present application will be described in detail with reference to the accompanying drawings. It is to be noted that the disclosed technology is not limited to the embodiment.

Embodiment

Configuration of Semiconductor Device

Figure 1:
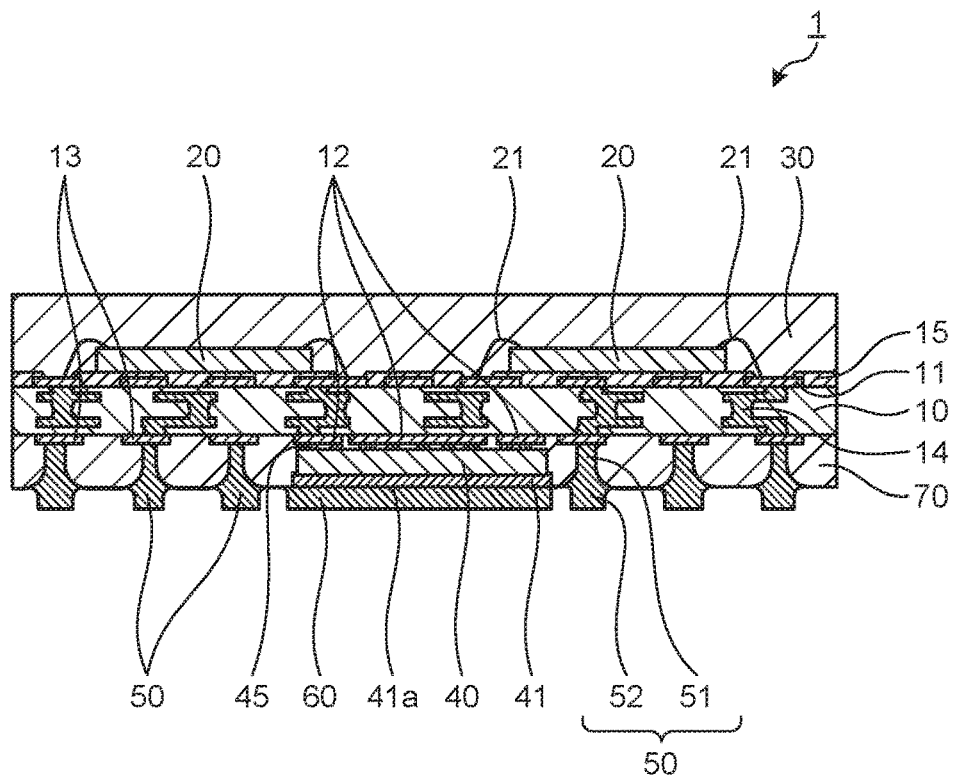
FIG. 1 is a diagram illustrating an example of a configuration of a semiconductor device according to an embodiment.

FIG. 1 is a diagram illustrating an example of a configuration of a semiconductor device 1 according to an embodiment. Hereinafter, the upper-side surface in FIG. 1 is suitably referred to as a "front surface", and a lower-side surface in FIG. 1 is suitably referred to as a "rear surface".

As illustrated in FIG. 1, the semiconductor device 1 includes a substrate 10, a semiconductor element 20, and a sealing resin 30.

For example, the substrate 10 is an organic substrate and the like. A circuit pattern 11 is formed on the front surface of the substrate 10, and a plurality of electrodes 12 for elements and a plurality of electrodes 13 for terminals are formed on the rear surface of the substrate 10. Hereinafter, if the electrodes 12 for elements need not be distinguished from each other, the electrodes 12 for elements are suitably referred to as an "electrode 12 for an element". Similarly, if the electrodes 13 for terminals need not be distinguished from each other, the electrodes 13 for terminals are suitably referred to as an "electrode 13 for a terminal" in a collective manner. The electrode 12 for an element is an example of a first electrode, and the electrode 13 for a terminal is an example of a second electrode. A wiring layer 14 is formed inside the substrate 10. The wiring layer 14 electrically connects the circuit pattern 11 formed on the front surface of the substrate 10 to the electrode 12 for an element or the electrode 13 for a terminal formed on the rear surface of the substrate 10. Moreover, a solder resist film 15 is selectively formed on the front surface of the substrate 10.

For example, the semiconductor element 20 is an integrated circuit such as memory. The semiconductor element 20 is mounted on the front surface of the substrate 10 by wire bonding. In other words, the semiconductor element 20 is connected to a contact pad of the circuit pattern 11 via a bonding wire 21.

For example, the sealing resin 30 is an epoxy resin, a silicone resin, and the like. At the front surface side of the substrate 10, the sealing resin 30 covers the semiconductor element 20 and the bonding wire 21.

Furthermore, the semiconductor device 1 includes a semiconductor element 40, an electrode terminal 50, a heat sink 60, and a sealing resin 70.

The semiconductor element 40 is, for example, an integrated circuit such as a processor. On the rear surface of the substrate 10, the semiconductor element 40 is mounted on the electrode 12 for an element of the substrate 10 by flip-chip mounting. In other words, the semiconductor element 40 is connected to the electrode 12 for an element of the substrate 10 with a bump 45 interposed therebetween. A thermal conductive sheet 41 is provided on a surface of the semiconductor element 40, the surface facing away from the substrate 10. The thermal conductive sheet 41 is interposed between the semiconductor element 40 and the heat sink 60, and transmits the heat generated by the semiconductor element 40 to the heat sink 60. A surface 41a, facing away from the substrate 10, of the thermal conductive sheet 41 is exposed from the sealing resin 70. Hereinafter, a combination of the semiconductor element 40 and the thermal conductive sheet 41 is suitably referred to as a "semiconductor element 40". Moreover, hereinafter, the surface 41a facing away from the substrate 10 of the thermal conductive sheet 41 is suitably referred to as a "rear surface 41a of the semiconductor element 40".

The electrode terminal 50 is a terminal that is drawn out to the outside of the semiconductor device 1 and that is connected to a printed circuit board (PCB). For example, the electrode terminal 50 is formed of metal such as copper. The electrode terminal 50 is connected to the electrode 13 for a terminal of the substrate 10. In the present embodiment, each of a plurality of the electrode terminals 50 is connected to the electrode 13 for a terminal of the substrate 10. Hereinafter, if the electrode terminals 50 need not be distinguished from each other, the electrode terminals 50 are suitably referred to as an "electrode terminal 50". The electrode terminal 50 includes a base end part 51 and a tip end part 52. The base end part 51 is connected to the electrode 13 for a terminal of the substrate 10, and has the side surface that is covered by the sealing resin 70. The tip end part 52 is integrally formed with the base end part 51, and projects from the front surface of the sealing resin 70. The detailed structure of the electrode terminal 50 will be described below.

The heat sink 60 covers the rear surface 41a of the semiconductor element 40. The heat generated from the semiconductor element 40 is transmitted to the heat sink 60 via the thermal conductive sheet 41, and is released into the atmosphere from the heat sink 60. Alternatively, the heat sink 60 may be connected to a heat radiation terminal provided on a printed circuit board, and the heat may be released to the outside via the printed circuit board.

For example, the sealing resin 70 is an epoxy resin, a silicone resin, and the like. At the rear surface side of the substrate 10, the sealing resin 70 covers the electrode 12 for an element, the semiconductor element 40, the electrode 13 for a terminal, and the electrode terminal 50, with the tip end part 52 of the electrode terminal 50 and the rear surface 41a of the semiconductor element 40 being exposed.

Figure 2:
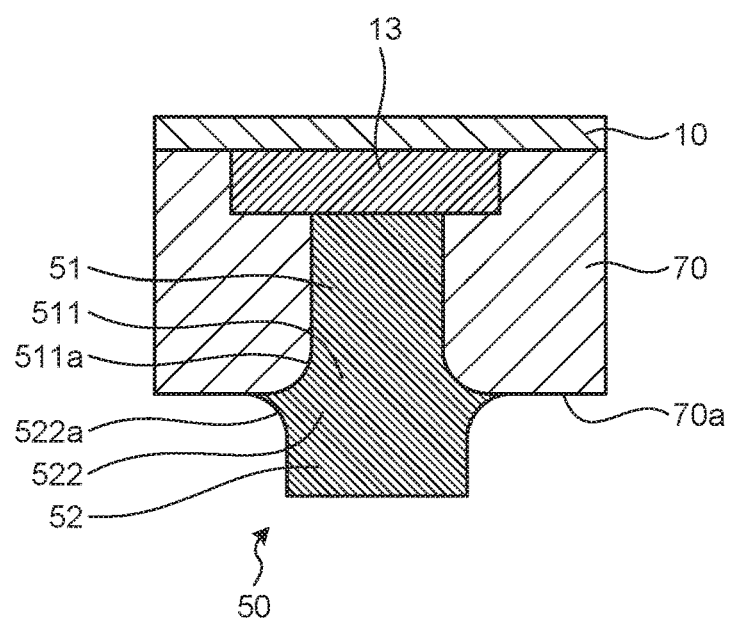
FIG. 2 is a partially enlarged sectional view illustrating an enlarged structure of an electrode terminal in the embodiment.

FIG. 2 is a partially enlarged sectional view illustrating an enlarged structure of the electrode terminal 50 in the embodiment. As illustrated in FIG. 2, the electrode terminal 50 includes the base end part 51 and the tip end part 52. The base end part 51 is connected to the electrode 13 for a terminal of the substrate 10, and has a side surface 51a that is covered by the sealing resin 70. The tip end part 52 is integrally formed with the base end part 51, and projects from a front surface 70a of the sealing resin 70 without being covered by the sealing resin 70. The tip end part 52 includes a skirting part 522 the diameter of which increases toward the base end part 51 side. An inclined surface (side surface) 522a of the skirting part 522 is a concave curved surface, and extends along the front surface 70a of the sealing resin 70. The base end part 51 includes a skirting part 511 the diameter of which increases toward the tip end part 52 side. An inclined surface (side surface) 511a of the skirting part 511 is a concave curved surface, and is placed above the inclined surface 522a of the skirting part 522. In other words, when viewed from a direction perpendicular to the front surface 70a of the sealing resin 70 (in other words, the longitudinal direction of the electrode terminal 50), the inclined surface 511a of the skirting part 511 forms a concave curved surface at a position overlapping with the inclined surface 522a of the skirting part 522, and comes into contact with the sealing resin 70 at the concave curved surface.

In the semiconductor device, the electrode terminal 50 is sometimes formed by using the SAP method. The electrode terminal 50 formed by using the SAP method includes a discontinuous corner at a boundary portion between the base end part 51 covered by the sealing resin 70 and the tip end part 52 exposed from the sealing resin 70. In the semiconductor device, the sealing resin 70 comes into contact with the corner of the electrode terminal 50. In a structure in which the sealing resin comes into contact with the corner of the electrode terminal 50, when the electrode terminal 50 is connected to the PCB, stress is concentrated on the sealing resin 70 that comes into contact with the corner. Consequently, a crack may be generated on the sealing resin 70.

Thus, in the semiconductor device 1 of the present embodiment, as illustrated in FIG. 2, the skirting part 511 the diameter of which increases toward the tip end part 52 side of the electrode terminal 50 is provided on the base end part 51 of the electrode terminal 50, and the inclined surface 511a of the skirting part 511 is formed into a concave curved surface. Thus, the sealing resin 70 comes into contact with the concave curved surface in the inclined surface 511a of the skirting part 511. Consequently, when the electrode terminal 50 is connected to the PCB, it is possible to suppress stress concentration to the sealing resin 70. As a result, it is possible to prevent a crack from being generated on the sealing resin 70.

Manufacturing Method of Semiconductor Device

Next, a manufacturing method of the semiconductor device 1 according to the embodiment will be described with reference to FIGS. 3A to 3I. FIG. 3A to FIG. 3I are each an explanatory diagram illustrating an example of a flow of a manufacturing method of the semiconductor device 1 according to the embodiment.

First, as illustrated in FIG. 3A, the substrate 10 is disposed such that the front surface faces downward and the rear surface faces upward. Moreover, the semiconductor element 40 is mounted on the electrode 12 for an element that is disposed on the rear surface of the substrate 10 by flip-chip mounting. In other words, the electrode 12 for an element of the substrate 10 is connected to the semiconductor element 40 with the bump 45 interposed therebetween.

Figure 3B:
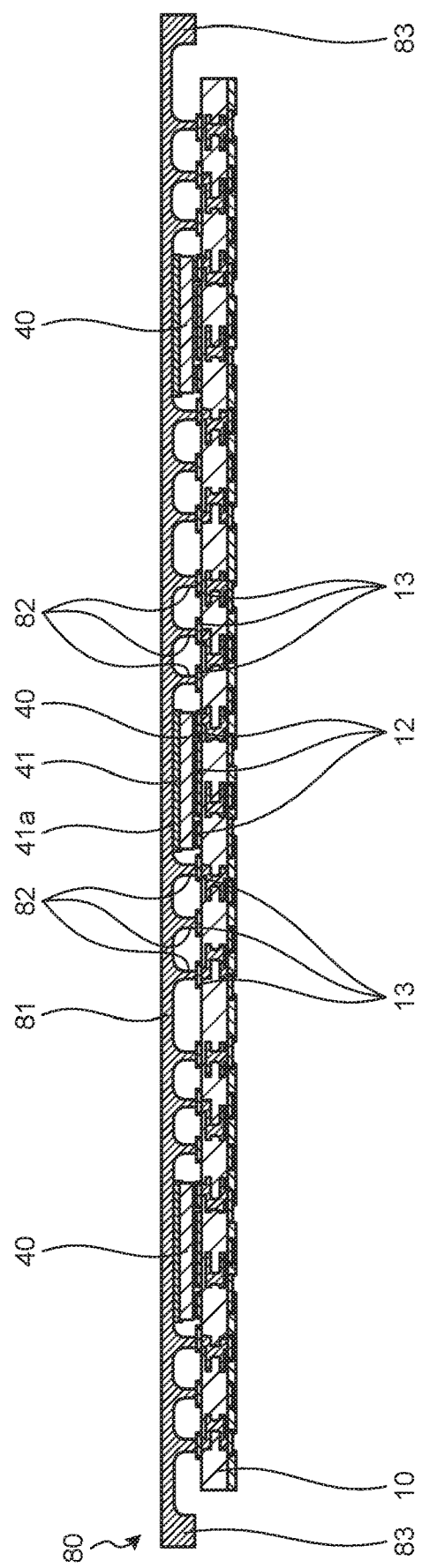
FIG. 3B is an explanatory diagram illustrating an example of a flow of the manufacturing method of the semiconductor device according to the embodiment.

Next, as illustrated in FIG. 3B, a metal plate 80 including a main body part 81 and a projection part 82 that rises from the main body part 81 is prepared. By joining the projection part 82 with the electrode 13 for a terminal that is disposed on the rear surface of the substrate 10, the metal plate 80 is mounted on the rear surface side of the substrate 10. For example, the projection part 82 and the electrode 13 for a terminal of the substrate 10 are joined by soldering or by using conductive paste. For example, metal such as copper is used as the material of the metal plate 80. In addition to the main body part 81 and the projection part 82, the metal plate 80 further includes an outer periphery part 83 that rises from an area surrounding the projection part 82 in the main body part 81. For example, the metal plate 80 is formed by performing half-etching on a metal flat plate. A process of forming the metal plate 80 will be described below.

Figure 3C:
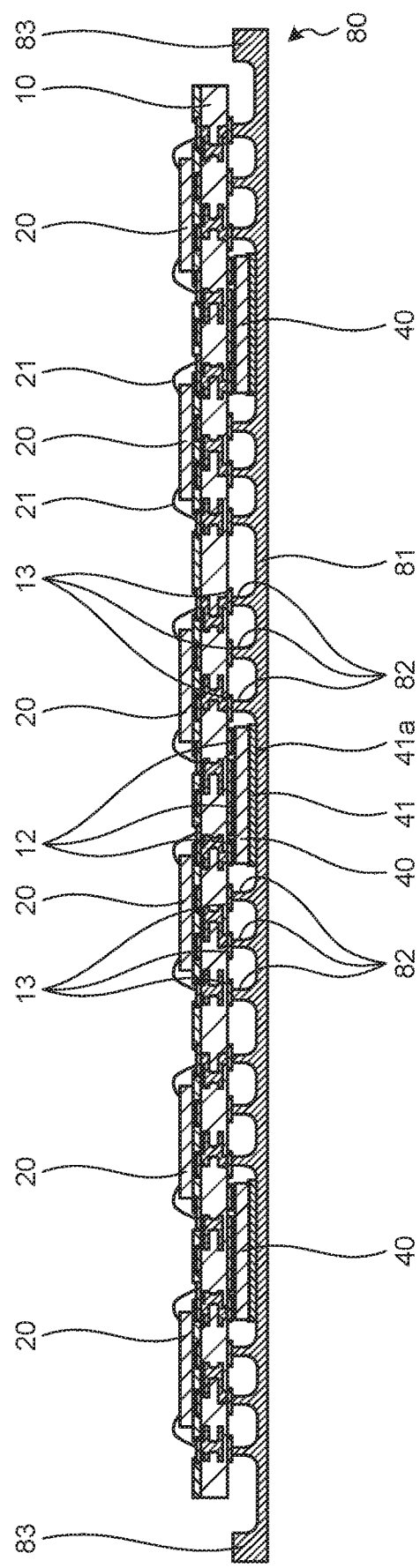
FIG. 3C is an explanatory diagram illustrating an example of a flow of the manufacturing method of the semiconductor device according to the embodiment.

Next, as illustrated in FIG. 3C, the substrate 10 is turned upside down, and the semiconductor element 20 is mounted on the front surface of the substrate 10 by wire bonding. In other words, a contact pad (not illustrated) of the circuit pattern 11 and the semiconductor element 20 are connected via the bonding wire 21.

Figure 3D:
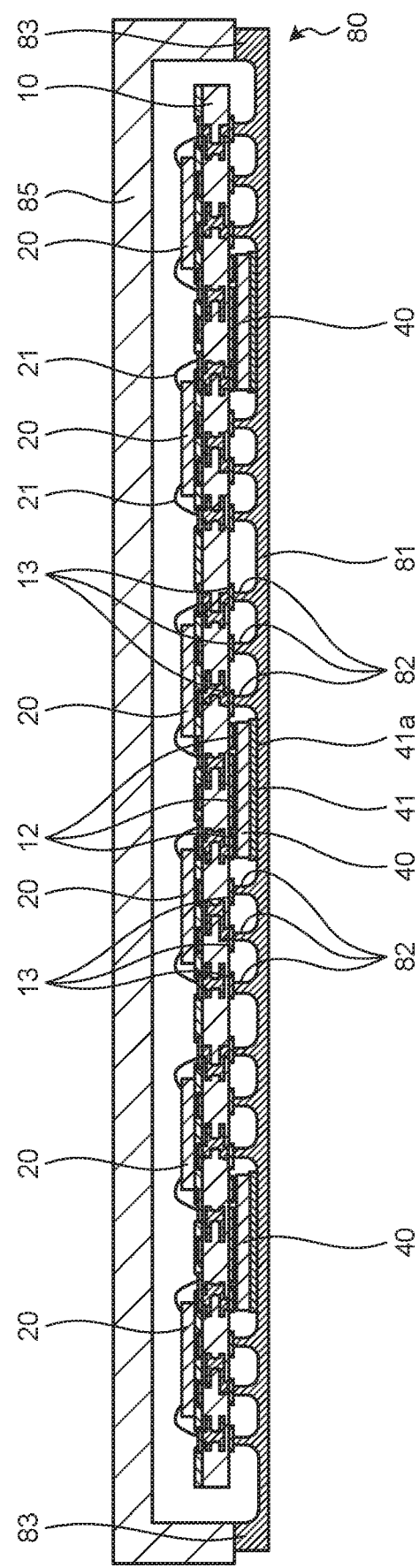
FIG. 3D is an explanatory diagram illustrating an example of a flow of the manufacturing method of the semiconductor device according to the embodiment.

Next, as illustrated in FIG. 3D, by assembling a mold 85 to the outer periphery part 83 of the metal plate 80, space is formed between the mold 85 and the metal plate 80.

Figure 3E:
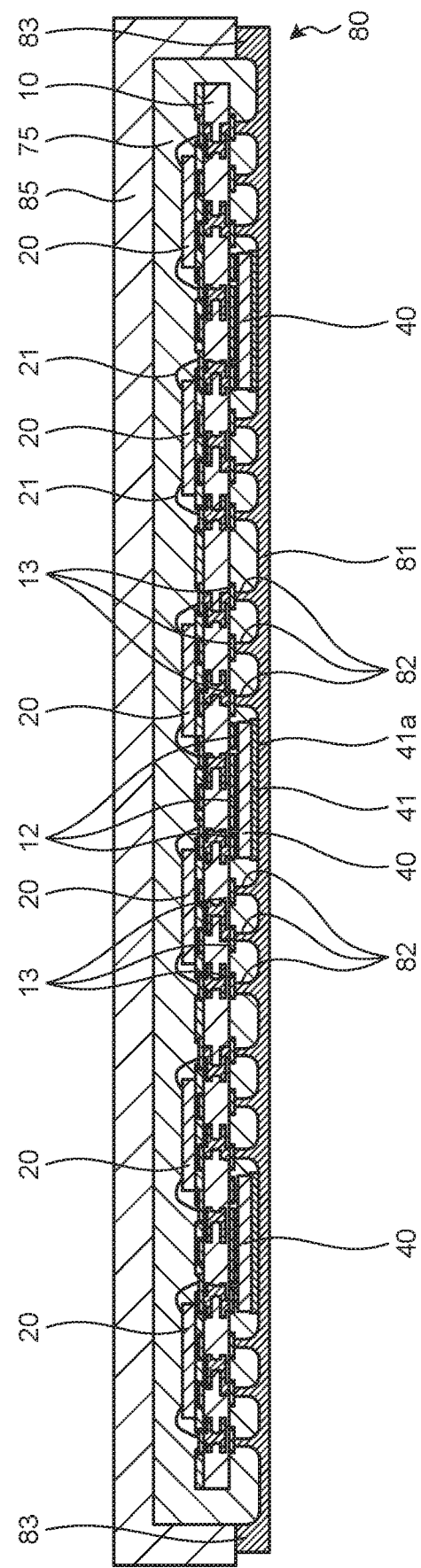
FIG. 3E is an explanatory diagram illustrating an example of a flow of the manufacturing method of the semiconductor device according to the embodiment.

Next, as illustrated in FIG. 3E, a sealing resin 75 is filled into the space formed between the mold 85 and the metal plate 80. Consequently, the sealing resin 75 is filled between the rear surface of the substrate 10 and the main body part 81 of the metal plate 80, and the substrate 10, the electrode 12 for an element, the semiconductor element 40, the electrode 13 for a terminal, and the projection part 82 are sealed by the sealing resin 75. At this process, a skirting part 821, which will be described below, of the projection part 82 is covered by the sealing resin 75. Moreover, the sealing resin 75 is filled between the front surface of the substrate 10 and the mold 85, and the semiconductor element 20 and the bonding wire 21 are sealed by the sealing resin 75.

Figure 3F:
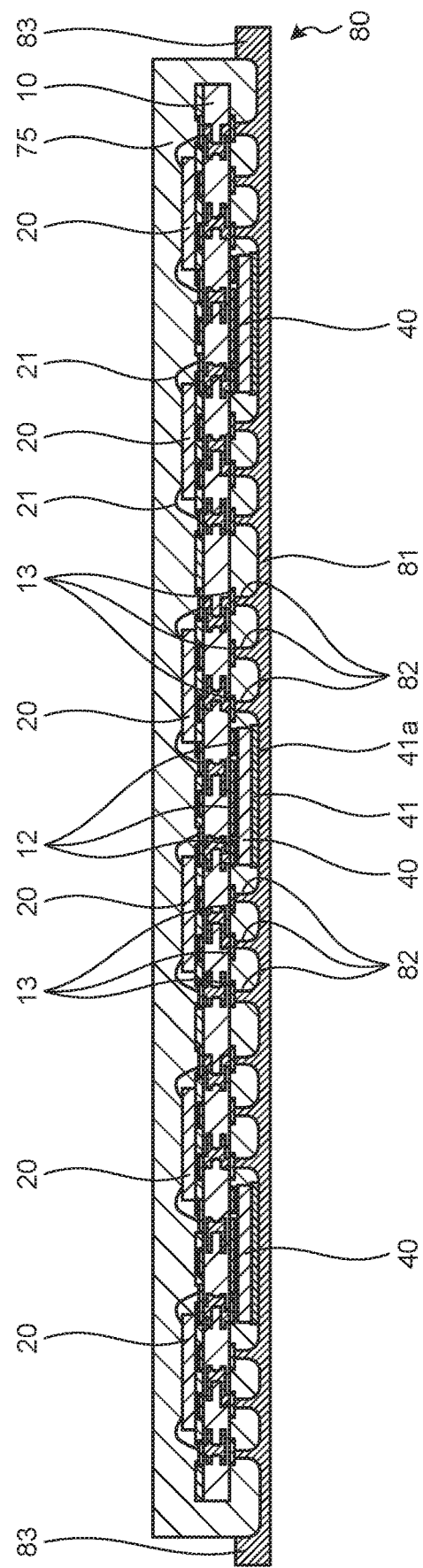
FIG. 3F is an explanatory diagram illustrating an example of a flow of the manufacturing method of the semiconductor device according to the embodiment.

Next, as illustrated in FIG. 3F, the mold 85 is removed from the outer periphery part 83 of the metal plate 80.

Figure 3G:
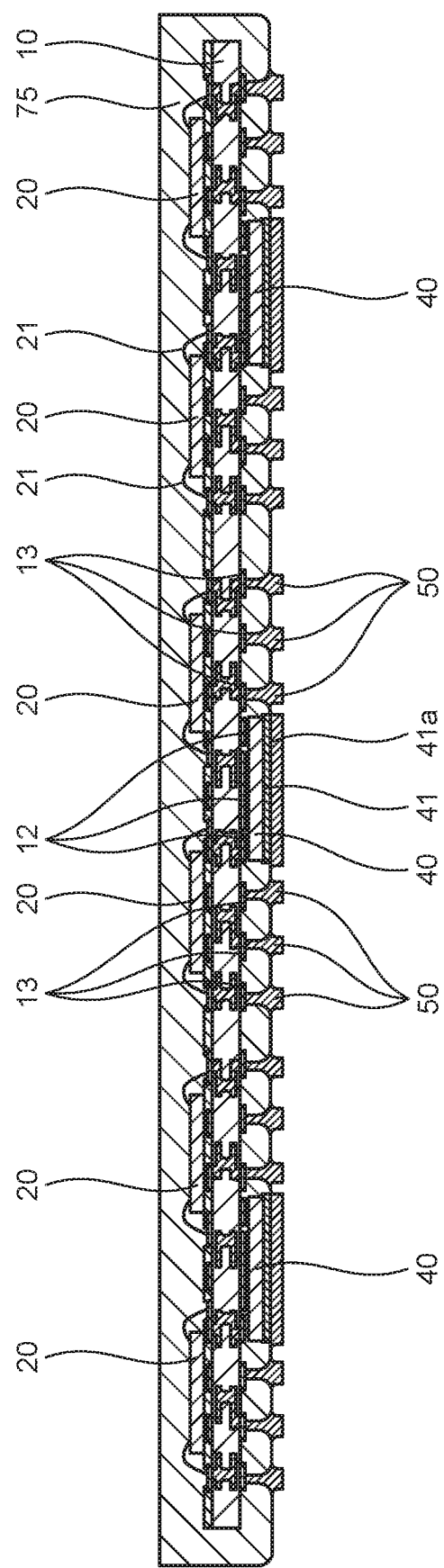
FIG. 3G is an explanatory diagram illustrating an example of a flow of the manufacturing method of the semiconductor device according to the embodiment.

Next, as illustrated in FIG. 3G, the electrode terminal 50 is formed by etching the main body part 81 excluding a portion overlapping with the projection part 82 in the main body part 81 in a plan view. In other words, the electrode terminal 50 including the base end part 51 and the tip end part 52 is formed. The base end part 51 is connected to the electrode 13 for a terminal, and has the side surface that is covered by the sealing resin 75. The tip end part 52 is integrally formed with the base end part 51, and projects from the front surface of the sealing resin 75. At this process, the skirting part 511 the diameter of which increases toward the tip end part 52 side of the electrode terminal 50 is formed on the base end part 51 of the electrode terminal 50, and the inclined surface 511a of the skirting part 511 is formed in a concave curved surface shape. Moreover, as illustrated in FIG. 3G, by etching the main body part 81 excluding the portion overlapping with the semiconductor element 40 in the main body part 81 in a plan view, the heat sink 60 that covers the rear surface 41a of the semiconductor element 40 is formed with the electrode terminal 50. By forming the heat sink 60 and the electrode terminal 50 from the same metal plate 80, the surface of the heat sink 60 facing away from the substrate 10 is flush with the surface of the tip end part 52 of the electrode terminal 50 facing away from the substrate 10.

Figure 3H:
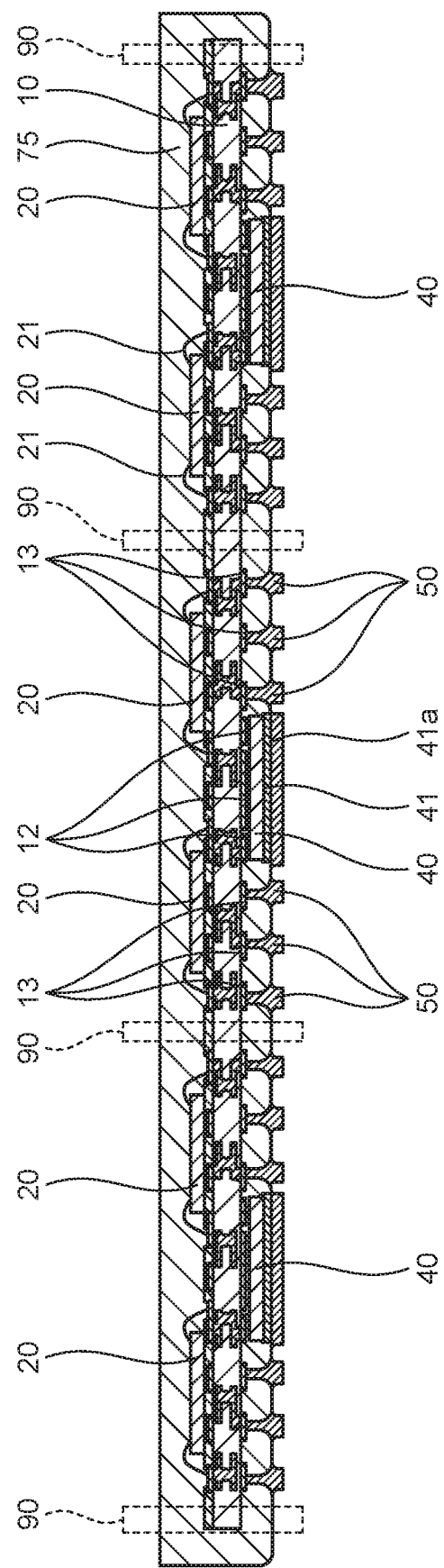
FIG. 3H is an explanatory diagram illustrating an example of a flow of the manufacturing method of the semiconductor device according to the embodiment.

Next, as illustrated in FIG. 3H, the substrate 10 is divided into pieces by cutting the substrate 10 and the sealing resin 75 by a blade 90.

Figure 3I:
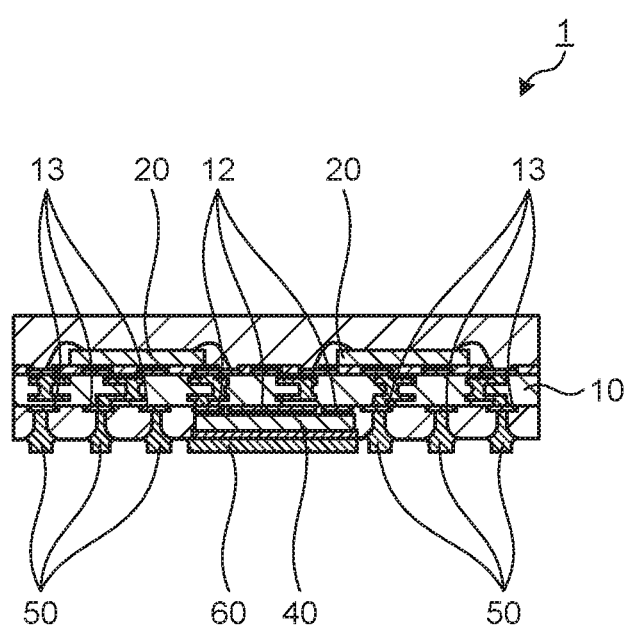
FIG. 3I is an explanatory diagram illustrating an example of a flow of the manufacturing method of the semiconductor device according to the embodiment.

In this manner, as illustrated in FIG. 3I, the semiconductor device 1 is manufactured.

Process of Forming Metal Plate

Figure 4A:
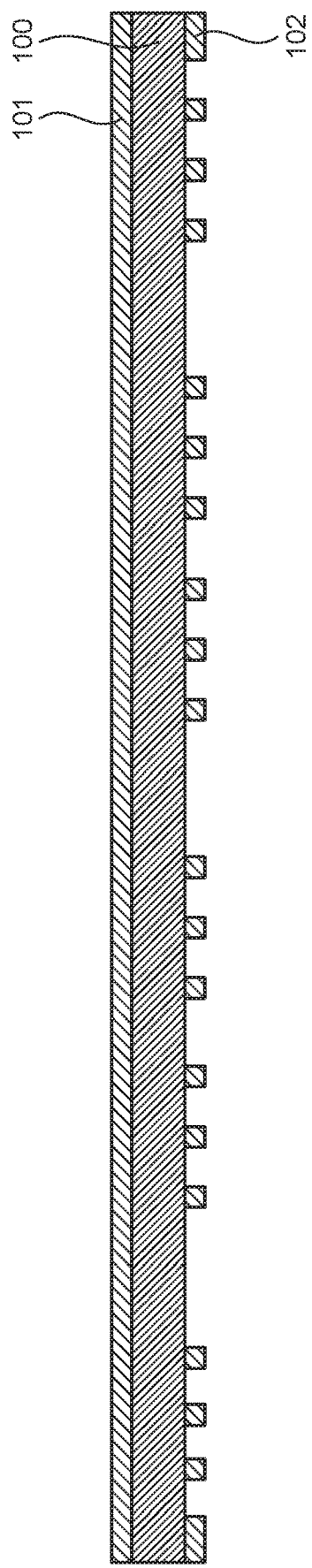
FIG. 4A is an explanatory diagram illustrating an example of a process of forming a metal plate.
Figure 4B:
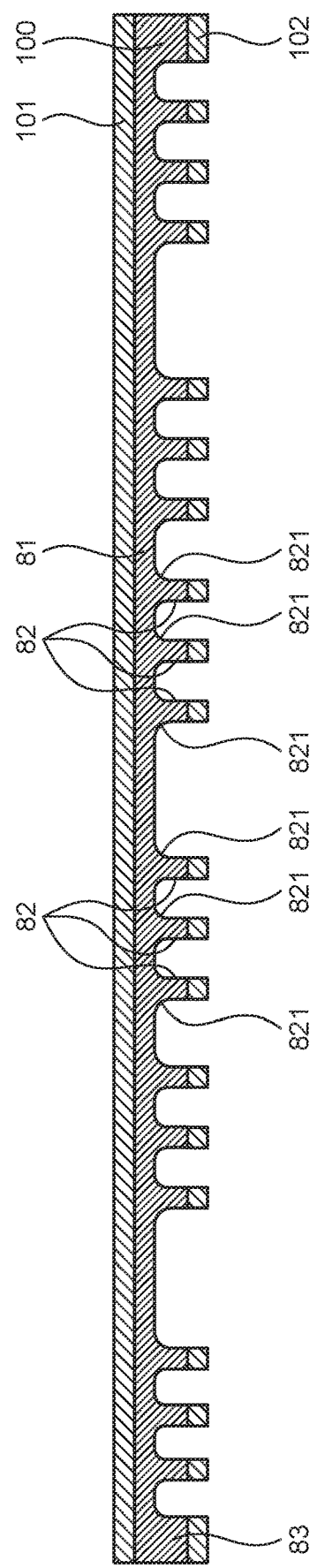
FIG. 4B is an explanatory diagram illustrating an example of the process of forming the metal plate.
Figure 4C:
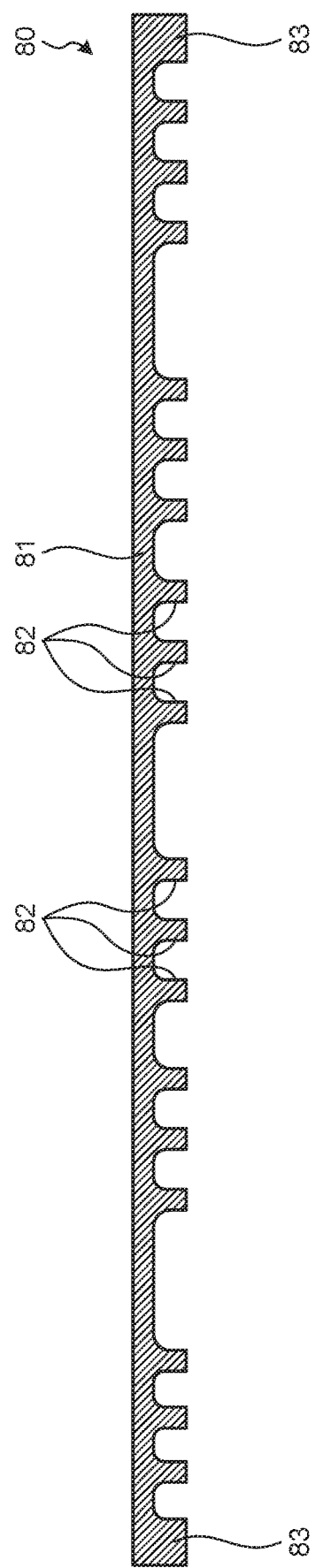
FIG. 4C is an explanatory diagram illustrating an example of the process of forming the metal plate.

FIG. 4A to FIG. 4C are each an explanatory diagram illustrating an example of a process of forming the metal plate 80. For example, the process of forming the metal plate 80 is executed before a process of joining the projection part 82 and the electrode 13 for a terminal of the substrate 10 (in other words, the process illustrated in FIG. 3B).

As illustrated in FIG. 4A, by exposing and developing a photosensitive resist that is applied on the front surface and the rear surface of a metal flat plate 100 and the like, a resist layer 101 that does not have an opening part and a resist layer 102 that has an opening part are formed.

Next, as illustrated in FIG. 4B, by performing half-etching on a portion other than the portion to be the projection part 82 from the rear surface side of the metal flat plate 100, using the resist layer 102 as a mask, the main body part 81, the projection part 82, and the outer periphery part 83 are formed. At this process, the skirting part 821 the diameter of which increases toward the main body part 81 side and the inclined surface (side surface) of which is a concave curved surface is formed at the main body part 81 side of the projection part 82. At the process illustrated in FIG. 3E described above, the skirting part 821 is a portion covered by the sealing resin 75.

Next, as illustrated in FIG. 4C, the resist layers 101 and 102 are peeled off. In this manner, the metal plate 80 is formed.

For the semiconductor device, the electrode terminal 50 is sometimes formed by using the SAP method. When the electrode terminal 50 is formed by using the SAP method, a via hole is formed on the sealing resin 75. In the semiconductor device, the aspect ratio of the via hole formed on the sealing resin 75 tends to increase. When the aspect ratio of the via hole increases, the via hole is sometimes not completely filled with a conductive material such as plating. Even if the via hole is filled with a conductive material, it may take a long time to fill the via hole with the conductive material. Moreover, when a wet process such as the SAP method is applied to the semiconductor element 20 and the semiconductor element 40 having relatively low resistance against an electrolyte solution, the semiconductor element 20 and the semiconductor element 40 may be damaged.

Thus, in the manufacturing method of the semiconductor device 1, as illustrated in FIG. 3A to FIG. 3I, the electrode terminal 50 is formed by using the metal plate 80. Consequently, compared with a conventional method using the SAP method, the manufacturing method of the semiconductor device 1 can reduce the time required for forming the electrode terminal 50. Consequently, it is possible to avoid the semiconductor element 20 and the semiconductor element 40 from being damaged.

As described above, in the manufacturing method of the semiconductor device 1 according to the embodiment, the semiconductor element 40 is mounted on the electrode 12 for an element disposed on the rear surface of the substrate 10. Next, in the manufacturing method, the metal plate 80 including the main body part 81 and the projection part 82 that rises from the main body part 81 is prepared. Next, in the manufacturing method, by joining the projection part 82 with the electrode 13 for a terminal disposed on the rear surface of the substrate 10, the metal plate 80 is mounted on the rear surface side of the substrate 10. Next, in the manufacturing method, the sealing resin 75 is filled between the rear surface of the substrate 10 and the main body part 81 of the metal plate 80, and the semiconductor element 40 and the projection part 82 are sealed by the sealing resin 75. Then, in the manufacturing method, the electrode terminal 50 is formed by etching the main body part 81 excluding the portion overlapping with the projection part 82 in the main body part 81 in a plan view. The electrode terminal 50 includes the base end part 51 and the tip end part 52. The base end part 51 is connected to the electrode 13 for a terminal and has the side surface that is covered by the sealing resin 75. The tip end part 52 is integrally formed with the base end part 51 and projects from the front surface of the sealing resin 75. Consequently, the manufacturing method of the semiconductor device 1 according to the embodiment can form the electrode terminal 50 without using the SAP method. Thus, with the manufacturing method of the semiconductor device 1 according to the embodiment, it is possible to reduce the time required for forming the electrode terminal 50, and avoid the semiconductor element from being damaged.

Moreover, in the manufacturing method of the semiconductor device 1 according to the embodiment, the metal plate 80 further includes the outer periphery part 83 that rises from the area surrounding the projection part 82 in the main body part 81. Then, in the manufacturing method, at a process of sealing, space is formed between the mold 85 and the metal plate 80, by assembling the mold 85 to the outer periphery part 83 of the metal plate 80. Then, at the process of sealing, the sealing resin 75 is filled into the space between the mold 85 and the metal plate 80. Thus, with the manufacturing method, the sealing by the sealing resin 75 can be effectively carried out, by using the metal plate 80 as a receptacle for the sealing resin 75.

Furthermore, in the manufacturing method of the semiconductor device 1 according to the embodiment, at a process of preparing the metal plate 80, the metal plate 80 is formed by performing half-etching on a portion other than the portion to be the projection part 82, from one surface side of the metal flat plate 100. Consequently, with the manufacturing method, it is possible to effectively form the metal plate 80 by the half-etching.

Still furthermore, in the manufacturing method of the semiconductor device 1 according to the embodiment, at a process of forming the electrode terminal 50, the main body part 81 is etched excluding the portion overlapping with the semiconductor element 40 in the main body part 81 in a plan view. Consequently, the heat sink 60 that covers the rear surface 41a of the semiconductor element 40 is formed with the electrode terminal 50. Thus, with the manufacturing method, it is possible to effectively form the heat sink 60.

Still furthermore, in the semiconductor device 1 according to the embodiment, the electrode terminal 50 includes the base end part 51 and the tip end part 52. The base end part 51 is connected to the electrode 13 for a terminal of the substrate 10, and has the side surface 51a that is covered by the sealing resin 70. The tip end part 52 is integrally formed with the base end part 51, and projects from the front surface 70a of the sealing resin 70 without being covered by the sealing resin 70. The tip end part 52 includes the skirting part 522 the diameter of which increases toward the base end part 51 side. The inclined surface (side surface) 522a of the skirting part 522 is formed in a concave curved surface. The base end part 51 includes the skirting part 511 the diameter of which increases toward the tip end part 52 side. The inclined surface (side surface) 511a of the skirting part 511 is formed in a concave curved surface. Consequently, with the semiconductor device 1 according to the embodiment, when the electrode terminal 50 is connected to the PCB, the stress concentration to the sealing resin 70 is suppressed by the concave curved surface of the inclined surface 511a of the skirting part 511. As a result, it is possible to prevent a crack from being generated on the sealing resin 70.

Modification

Figure 5:
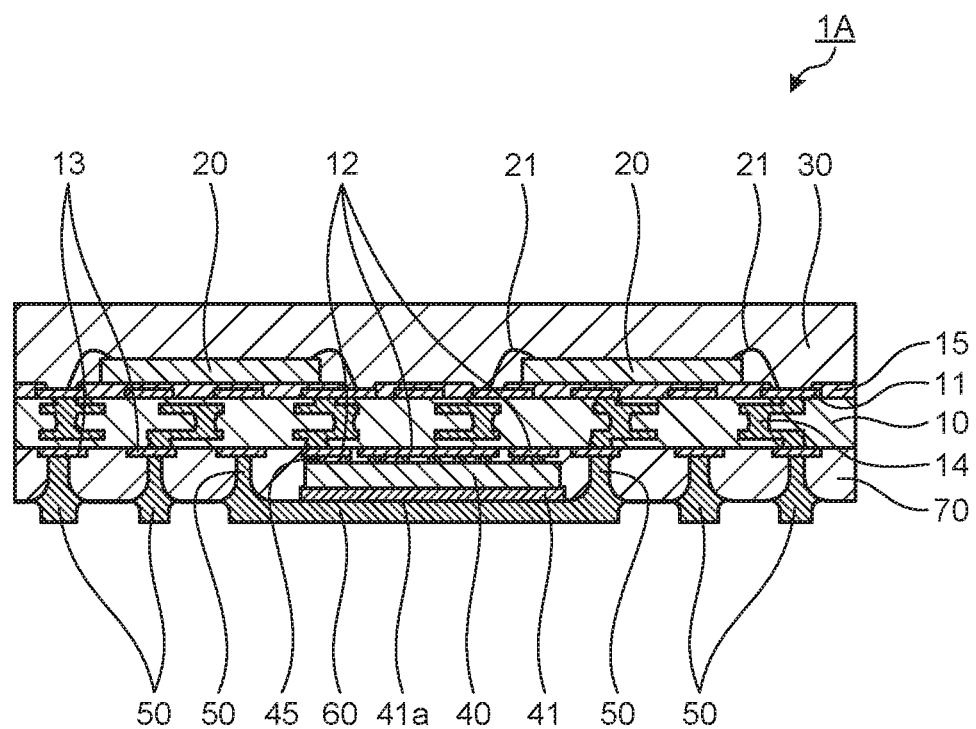
FIG. 5 is a diagram illustrating an example of a configuration of a heat sink in a modification.

In the embodiment described above, the heat sink 60 and the electrode terminals 50 are separated from each other. However, the disclosed technology is not limited thereto. For example, as illustrated in FIG. 5, the heat sink 60 may also be coupled to the electrode terminal 50 adjacent to the semiconductor element 40 in the electrode terminals 50. FIG. 5 is a diagram illustrating an example of a configuration of the heat sink 60 in a modification. The heat sink 60 in the modification is electrically connected to the substrate 10 via the electrode terminal 50 adjacent to the semiconductor element 40. Consequently, it is possible to use the heat sink 60 as a ground terminal and a terminal for power supply.

According to one aspect of the manufacturing method of the semiconductor device disclosed in the present application, it is possible to effectively form the electrode terminal without using the SAP method.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
    a substrate;
    a first electrode and a second electrode that are disposed on a first surface of the substrate;
    a semiconductor element mounted on the first electrode;
    an electrode terminal connected to the second electrode; and
    a sealing resin that is formed on the first surface of the substrate, the sealing resin covering the semiconductor element and a side surface of the electrode terminal, wherein
    the electrode terminal includes
        a base end part that is connected to the second electrode and has a side surface that is covered by the sealing resin, and
        a tip end part that is integrally formed with the base end part and that projects from a front surface of the sealing resin without being covered by the sealing resin,
    the base end part includes a base end skirting part having diameter that increases toward a side of the tip end part,
    an inclined surface of the base end skirting part is formed in a concave curved surface,
    a rear surface of the semiconductor element is exposed from the sealing resin, and
    the semiconductor device further comprises a heat sink that covers the rear surface of the semiconductor element on the sealing resin.

2. The semiconductor device according to claim 1, wherein
    the tip end part includes a tip end skirting part having diameter that increases toward a side of the base end part, and
    an inclined surface of the tip end skirting part is formed in a concave curved surface.

3. The semiconductor device according to claim 1, wherein
    a plurality of the electrode terminals are connected to a plurality of the second electrodes of the substrate respectively, and
    the heat sink is joined to an electrode terminal adjacent to the semiconductor element in the electrode terminals.

* * * * *